(12) United States Patent
Hwang et al.

(10) Patent No.: US 9,867,298 B2
(45) Date of Patent: Jan. 9, 2018

(54) CASE FRAME AND MANUFACTURING METHOD THEREOF

(71) Applicant: Samsung Electronics Co. Ltd., Suwon-si, Gyeonggi-do (KR)

(72) Inventors: Chang-Youn Hwang, Hwaseong-si (KR); Hak-Ju Kim, Gumi-si (KR); Yong-Geon Lee, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1192 days.

(21) Appl. No.: 13/960,175

(22) Filed: Aug. 6, 2013

(65) Prior Publication Data

US 2014/0118903 A1 May 1, 2014

(30) Foreign Application Priority Data

Nov. 1, 2012 (KR) .......................... 10-2012-0122890

(51) Int. Cl.
| | |
|---|---|
| *B05D 5/12* | (2006.01) |
| *H05K 5/02* | (2006.01) |
| *B32B 9/04* | (2006.01) |
| *C23C 14/00* | (2006.01) |
| *C23C 14/08* | (2006.01) |

(Continued)

(52) U.S. Cl.
CPC ................ *H05K 5/02* (2013.01); *B32B 9/04* (2013.01); *C23C 14/0015* (2013.01); *C23C 14/081* (2013.01); *C23C 14/083* (2013.01); *C23C 14/10* (2013.01); *C23C 14/30* (2013.01); *C23C 28/00* (2013.01); *C23C 28/42* (2013.01);

*C23C 28/44* (2013.01); *B32B 3/00* (2013.01); *B32B 15/04* (2013.01); *B32B 17/06* (2013.01);

(Continued)

(58) Field of Classification Search
USPC ....................................... 427/58, 97.1, 126.3
See application file for complete search history.

(56) References Cited

U.S. PATENT DOCUMENTS

| | | | | |
|---|---|---|---|---|
| 8,097,344 B2 * | 1/2012 | Chiang | .................... | C09D 1/00 428/469 |
| 8,184,259 B2 | 5/2012 | Omote et al. | | |

(Continued)

FOREIGN PATENT DOCUMENTS

| | | | |
|---|---|---|---|
| EP | 2 184 961 A1 | | 5/2010 |
| JP | 10020102 | * | 1/1998 |

(Continued)

*Primary Examiner* — Brian K Talbot
(74) *Attorney, Agent, or Firm* — Jefferson IP Law, LLP

(57) ABSTRACT

A case frame used in various devices and a method of manufacturing the case frame are provided. The method includes forming the case frame in a shape corresponding to a product to which the case frame is applied, forming a first painting layer with a color of a material applied to a surface of the formed case frame, depositing a transparent oxide deposition layer having a refractive index on an upper portion of the first painting layer, and forming a second painting layer on an upper portion of the transparent oxide deposition layer. Accordingly, the case frame can have an excellent texture by reproducing a brightness and a color anisotropy on the basis of a viewing angle by adding only a simple manufacturing process, thereby being able to improve quality of an electronic device in general and to promote a user's desire for purchasing the device.

16 Claims, 4 Drawing Sheets

(51) Int. Cl.
*C23C 14/10* (2006.01)
*C23C 14/30* (2006.01)
*C23C 28/00* (2006.01)
*B32B 17/06* (2006.01)
*B32B 27/40* (2006.01)
*B32B 15/04* (2006.01)
*B32B 18/00* (2006.01)
*B32B 3/00* (2006.01)
*B32B 27/06* (2006.01)

(52) U.S. Cl.
CPC ............... *B32B 18/00* (2013.01); *B32B 27/06* (2013.01); *B32B 27/40* (2013.01)

(56) References Cited

U.S. PATENT DOCUMENTS

| | | | |
|---|---|---|---|
| 8,450,607 B2 * | 5/2013 | Du | B32B 37/24 174/50 |
| 8,507,107 B2 * | 8/2013 | Du | H05K 5/0243 361/600 |
| 2006/0216498 A1 * | 9/2006 | Chen | B05D 5/06 428/328 |
| 2009/0110852 A1 | 4/2009 | Chiang | |
| 2011/0143062 A1 | 6/2011 | Chiang et al. | |
| 2011/0159277 A1 * | 6/2011 | Chiang | B32B 33/00 428/336 |
| 2012/0084884 A1 | 4/2012 | Stewart et al. | |
| 2012/0088047 A1 | 4/2012 | Lei et al. | |
| 2012/0189842 A1 * | 7/2012 | Du | C23C 14/0015 428/336 |
| 2013/0257237 A1 * | 10/2013 | Cao | B32B 15/08 312/204 |

FOREIGN PATENT DOCUMENTS

| | | |
|---|---|---|
| JP | 2005-296841 A | 10/2005 |
| JP | 2010-516105 A | 5/2010 |
| JP | 2012-30478 A | 2/2012 |
| JP | 2012-084884 A | 4/2012 |
| KR | 10-2007-0035050 A | 3/2007 |
| KR | 10-2007-0066266 A | 6/2007 |
| KR | 10-2008-0112076 A | 12/2008 |
| KR | 10-2009-0051831 A | 5/2009 |

* cited by examiner

CASE FRAME AND MANUFACTURING METHOD THEREOF

CROSS-REFERENCE TO RELATED APPLICATION(S)

This application claims the benefit under 35 U.S.C. §119 (a) of a Korean patent application filed on Nov. 1, 2012 in the Korean Intellectual Property Office and assigned Serial No. 10-2012-122890, the entire disclosure of which is hereby incorporated by reference.

TECHNICAL FIELD

The present disclosure relates to a case frame for a device. More particularly, the present disclosure relates to a case frame used in various devices and a method for manufacturing the case frame, and electronic device thereof.

BACKGROUND

With the ongoing advances in mobile communication technology, a mobile terminal has become an essential part of most people's everyday life. For example, as the processing speed of the mobile terminal has increased, smart phones are now available with various additional enhanced functions such as web surfing and the like. As such, smart phones are now widely used and it is not an exaggeration to say that nearly everyone owns at least one mobile terminal.

Electronic devices are provided in various sizes according to their functions as well as users' preferences. Moreover, an outer appearance of the electronic devices has become important in addition to a compact size and advanced functions of the devices. That is, despite having nearly the same functions as devices of other vendors, an electronic device having a more elegant design is more preferred by a user.

Furthermore, a case frame (or a housing) which forms an outer appearance of the electronic device must also be pleasing in terms of a sense of touch and texture when it is held by a user, not to mention having an elegant design in general. That is, in contrast to the fast developing high-technology mindset regarding the functions of an electronic device, there is a tendency of users to prefer electronic devices having a nature-friendly design, touch, and texture.

However, an electronic device of the related art generally has a case frame painted in a single tone (e.g., black, white, colorless, etc.) and a soft-feel painting process is applied to the case frame.

Accordingly, a case frame having a superior texture and a method of making the same are required.

The above information is presented as background information only to assist with an understanding of the present disclosure. No determination has been made, and no assertion is made, as to whether any of the above might be applicable as prior art with regard to the present disclosure.

SUMMARY

An aspect of the present disclosure is to address at least the above-mentioned problems and/or disadvantages and to provide at least the advantages described below. Accordingly, an aspect of the present disclosure is to provide a case frame capable of displaying a certain texture by changing a refractive index depending on a viewing angle, and a method of manufacturing the case frame.

Another aspect of the present disclosure is to provide a case frame implemented to be cost competitive by allowing the case frame to have high quality while decreasing a manufacturing cost, and a method of manufacturing the case frame.

Another aspect of the present disclosure is to provide a case frame implemented to be able to reproduce a brightness and a color anisotropy in such a manner that a simple manufacturing process is added to have a directivity, and a method of manufacturing the case frame.

In accordance with an aspect of the present disclosure, a method of manufacturing a case frame is provided. The method includes forming the case frame in a shape corresponding to a product to which the case frame is applied, forming a first painting layer with a color of a material applied to a surface of the formed case frame, depositing a transparent oxide deposition layer having a refractive index on an upper portion of the first painting layer, and forming a second painting layer on an upper portion of the transparent oxide deposition layer.

In the aforementioned aspect of the present disclosure, the oxide deposition layer may be deposited several times by alternating at least two different types of deposition materials. The at least two different types of deposition materials may be selected from $SiO_2$—$TiO_2$, $Al_2O_3$—$TiO2$, $SiO_2$—$ZrO_2$, $Al_2O_3$—$ZrO_2$, and $SiO_2$—$Ta_2O_5$.

In addition, the oxide deposition layer may include a first deposition material having a first refractive index and formed by at least two types of mixtures selected from $SiO_2$—$TiO_2$, $Al_2O_3$—$TiO_2$, $SiO_2$—$ZrO_2$, $Al_2O_3$—$ZrO_2$, and $SiO_2$—$Ta_2O_5$, and a second deposition material having a second refractive index and formed by at least two types of mixtures selected from $SiO_2$—$TiO_2$, $Al_2O_3$—$TiO_2$, $SiO_2$—$ZrO_2$, $Al_2O_3$—$ZrO_2$, and $SiO_2$—$Ta2O_5$, wherein deposition is performed several times by alternating the first deposition material and the second deposition material.

In addition, the oxide deposition layer may be formed in such a manner that the at least two types of deposition materials are deposited in the range of 3 to 10 layers. The oxide deposition layer may be formed to have a thickness in the range of 0.05~0.3 μm.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features and advantages of various embodiments of the present disclosure will be more apparent from the following description taken in conjunction with the accompanying drawings, in which.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the present disclosure. In addition, descriptions of well-known functions and configurations may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

A mobile terminal is illustrated as an example of an electronic device in the following description, and a method of manufacturing a case frame of the mobile terminal will be described. However, the present disclosure is not limited thereto, and thus can apply to case frames of various devices, for example, portable electronic devices. That is, the present disclosure can apply to a device such as a portable terminal, a mobile pad, a media player, a tablet computer, a handheld computer, a Personal Digital Assistant (PDA), and the like. In addition to such electronic devices, the present disclosure is also applicable to various products having case frames.

Figure 1:
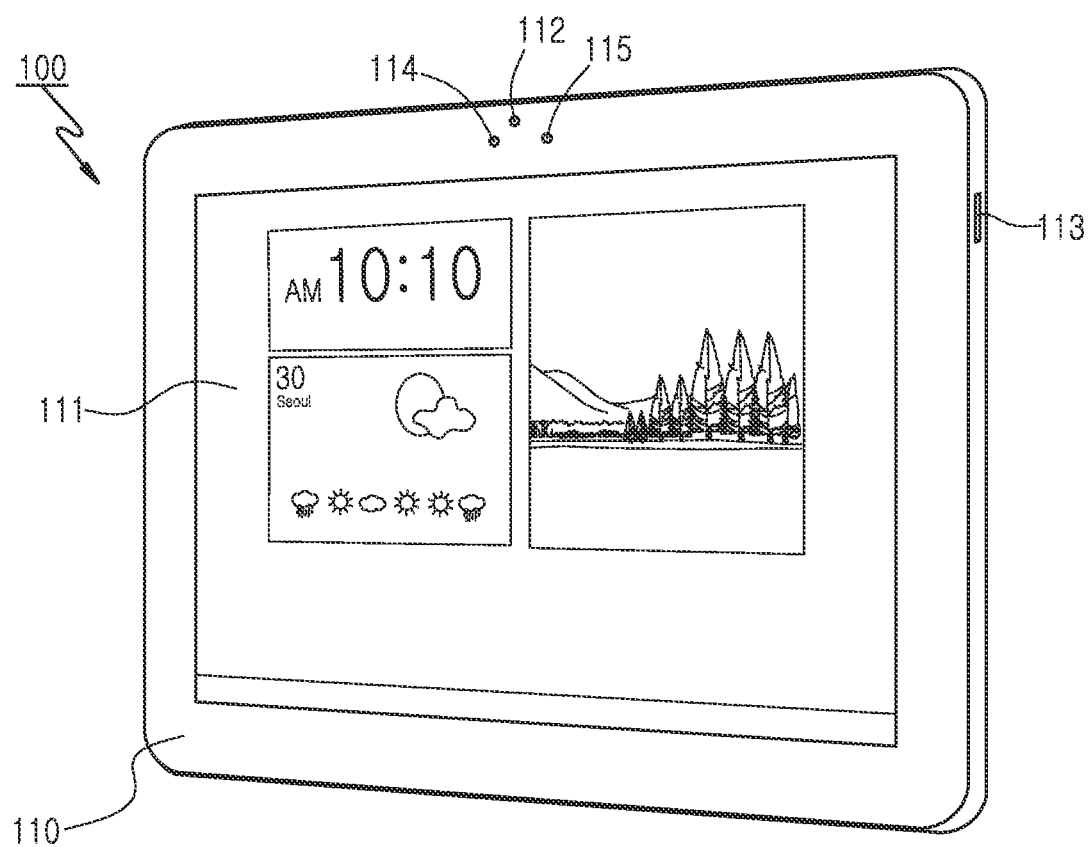
FIG. 1 is a front perspective view of an electronic device having a case frame according to an embodiment of the present disclosure.
Figure 2:
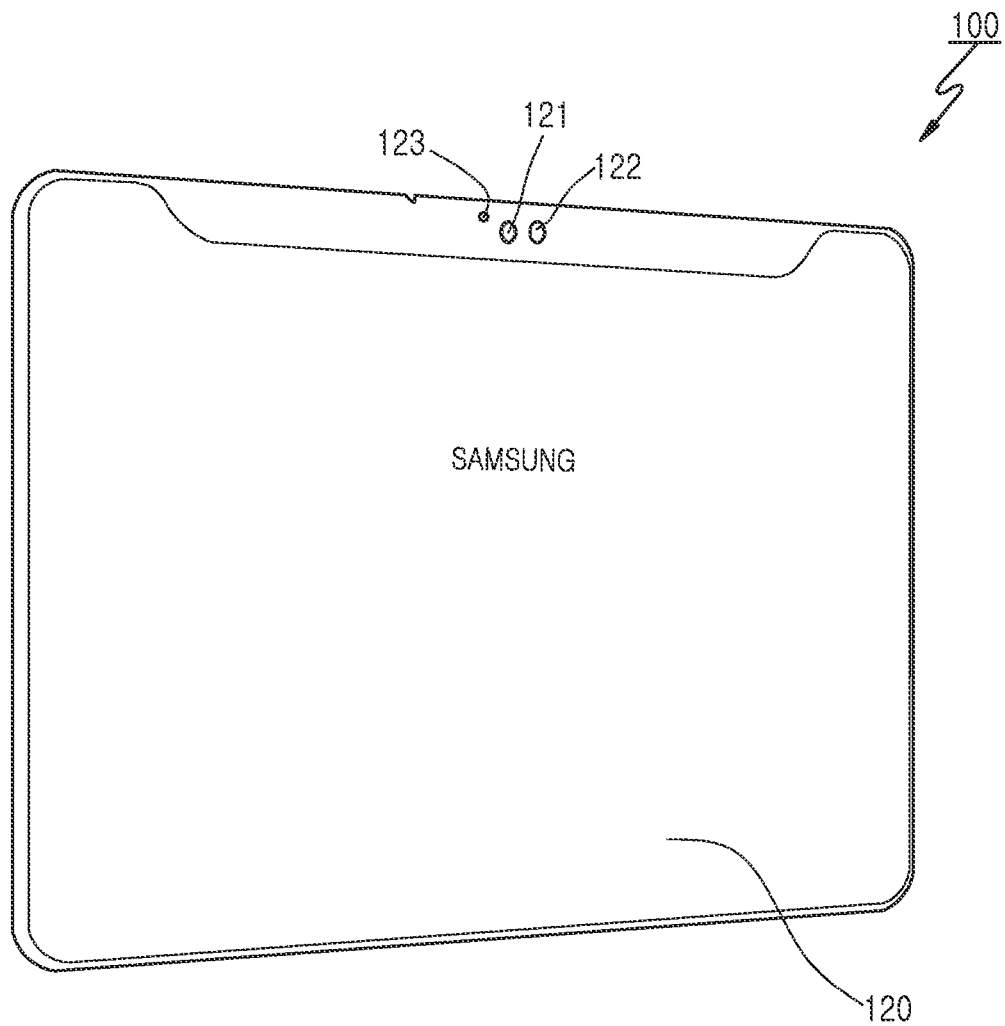
FIG. 2 is a rear perspective view of the electronic device of FIG. 1 according to an embodiment of the present disclosure.

FIG. 1 and FIG. 2 are respectively front and rear perspective views of an electronic device having a case frame according to an embodiment of the present disclosure.

Referring to FIG. 1 and FIG. 2, a front case frame 110 and a rear case frame 120 are joined to form an outer appearance of an electronic device 100. In this case, a plurality of electronic components having different functions, such as a circuit board, may be placed in an inner space formed by the front case frame 110 and the rear care frame 120.

A mobile pad or a tablet Personal Computer (PC) is illustrated as the electronic device 100 in the figures. However, this is merely an example and not to be construed as limiting. A display unit 111 is coupled to the front case frame 110 in an exposed manner. A sensor 114 and a main microphone unit 112 may be coupled to an upper portion of the display unit 111. An example of the sensor 114 may be an ambient-light sensor for automatically controlling illumination of the display unit 111 by sensing an ambient light beam. In addition, a camera module 115 for video telephony may be coupled to one side of the ambient-light sensor.

Referring to FIG. 2, another camera module 121 for capturing a subject of a photograph may be coupled to an upper portion of the rear case frame 120 of the electronic device 100. Further, a sub microphone unit 123 and a Light Emitting Diode (LED) module 122 may be included to attenuate noise of the main microphone unit 112. However, the present disclosure is not limited thereto, and thus various additional units may also be provided to perform additional functions of the electronic device 100 in addition to the aforementioned various sensors 114 and camera modules 115 and 121.

A speaker unit 113 may be coupled to a lateral portion of the electronic device 100 to provide a voice output of a peer user for voice communication or to provide an output of music, voice, sound, etc., of a multimedia file reproduced by the electronic device 100.

According to the present disclosure, the outer appearance of the front case frame 110 and the rear case frame 120 can be implemented by a manufacturing method of the present disclosure, except for a portion in which peripheral devices are exposed, such as the display unit 111, the microphone units 112 and 123, the camera modules 115 and 121, the LED module 122, or the like of the electronic device 100.

Although the electronic device 100 according to the embodiment of the present disclosure has a built-in battery pack, it is also possible to use an additional battery cover (not shown) to protect a battery pack disposed inside the electronic device 100 in an attachable/detachable manner. In this case, the battery cover can also be implemented by the frame case manufacturing method of the present disclosure.

Accordingly, the electronic device 100 of the present disclosure can provide a ceramic pearl texture by reproducing a brightness and a color anisotropy according to a viewing angle of a user, so that the electronic device can have high quality in general. In addition, the outer appearance of the electronic device can be improved.

Figure 3:
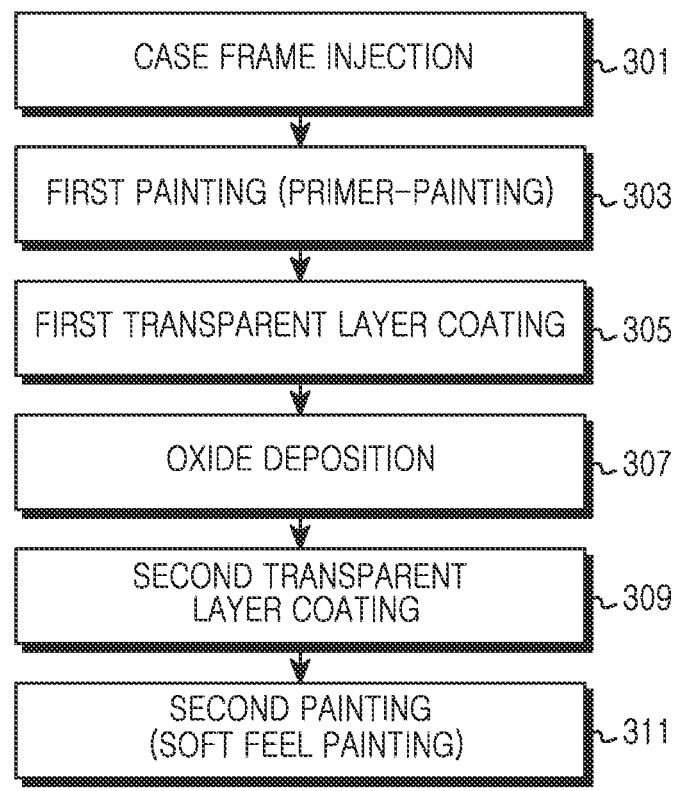
FIG. 3 is a flowchart illustrating a process of manufacturing a case frame of an electronic device according to an embodiment of the present disclosure.
Figure 4:
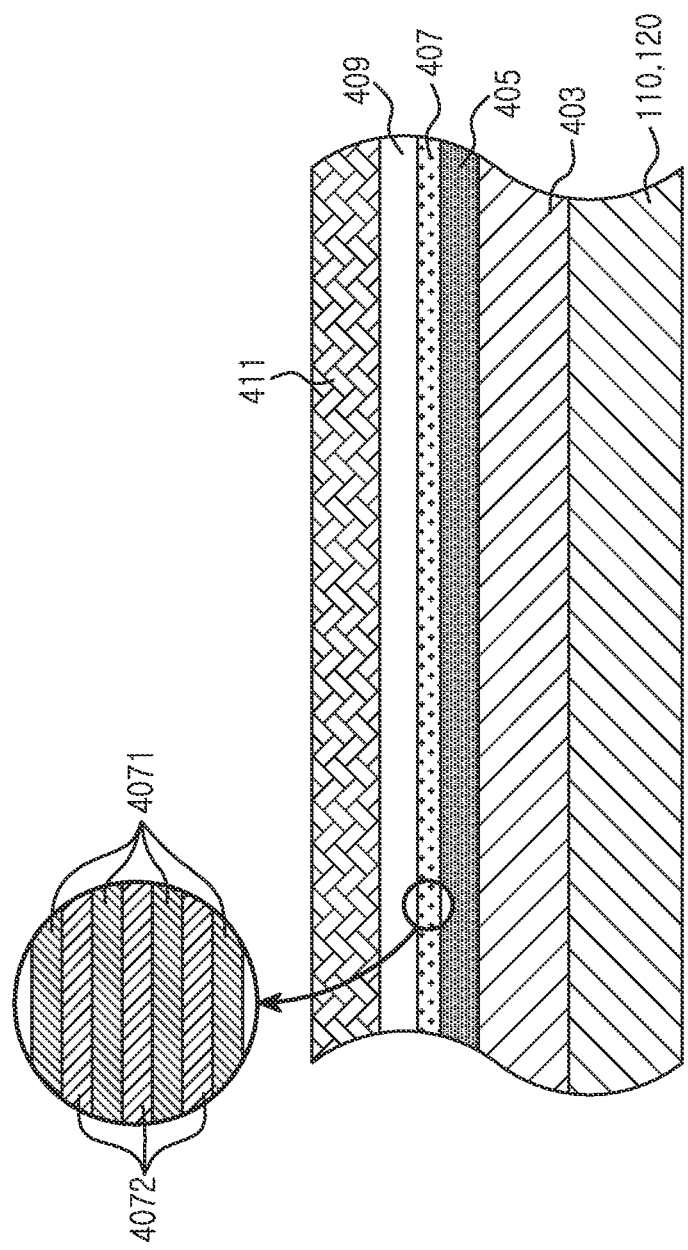
FIG. 4 is a cross-sectional view illustrating elements of a case frame according to an embodiment of the present disclosure.

FIG. 3 is a flowchart illustrating a process of manufacturing a case frame according to an embodiment of the present disclosure, and FIG. 4 is a cross-sectional view illustrating elements of a case frame according to an embodiment of the present disclosure.

Although not shown, it is possible to perform a process of producing a mold for forming the front case frame 110 and the rear case frame 120 having a specific shape according to a design of the electronic device 100. For example, in order to represent a texture of a natural material (e.g., a leaf, etc.) on a surface of a material of the front case frame 110 and the rear case frame 120, an injection surface of a mold for injecting an outer surface of the front case frame 110 and the rear case frame 120 can be produced by performing an etching process several times. For example, a film having a shape depending on the texture of the natural material is produced, and an injection surface of a mold can be etched several times by using the film so that various patterns of the natural material are formed on the surface thereof.

Referring to FIG. 3 and FIG. 4, the front case frame 110 and the rear case frame 120 made of a synthetic resin are injected by the mold formed as described above in operation 301.

In operation 303, a first painting process (i.e., a primer-painting process) is performed to form a basis color painting layer 403 of FIG. 4 by painting a basis color corresponding to the natural material.

In operation 305, a first transparent layer 405 of FIG. 4 is coated on an upper portion of the basis color painting layer 403 of the front case frame 110 and the rear case frame 120. The first transparent layer 405 can be formed by spray-painting an $SiO_2$-series solvent such as a glass component or an acrylic-series urethane. However, the present disclosure is not limited thereto, and thus can be formed to have a thickness in the range of 10~20 μm also by using a transparent urethane paint. In a next process, i.e., a process of smoothly performing a transparent oxide deposition process, the first transparent layer 405 serves to uniformly and smoothly coat and fix a deposition material onto the front case frame 110 and the rear case frame 120. The front case frame 110 and the rear case frame 120 coated with the first transparent layer 405 can be dried by using an oven or a natural drying process.

In operation 307, an oxide deposition layer 407 of FIG. 4 is formed in such a manner that deposition materials having different refraction indices are alternately deposited several times on an upper portion of the first transparent layer 405. The oxide deposition material is deposited repetitively 3 to 10 times, and thus the deposition materials having different refractive indices can reproduce a different brightness and a color anisotropy according to a viewing angle of a user. The oxide deposition layer 407 is preferably formed to have a thickness in the range of 0.05~0.3 μm.

Regarding the deposition materials having the different refraction indices, two materials selected from a silicon oxide layer (i.e., $SiO_2$), a titanium oxide layer (i.e., $TiO_2$), an aluminum oxide layer (i.e., $Al_2O_3$), a zirconium oxide layer (i.e., $ZrO_2$), and a tantalum oxide layer (i.e., $Ta_2O_5$) can be alternately deposited on the transparent oxide deposition layer 407. For example, the deposition layer can be formed by alternating the deposition materials formed with $SiO_2$—$TiO_2$, $Al_2O_3$—$TiO_2$, $SiO_2$—$ZrO_2$, $Al_2O_3$—$ZrO_2$, $SiO_2$—$Ta_2O_5$, etc.

However, the present disclosure is not limited thereto, and thus deposition can be achieved by alternating at least two types of deposition materials.

In addition, referring to FIG. 4, the at least two types of deposition materials can be mixed to form a first deposition material 4071 having a desired first refraction index and a second deposition material 4072 having a desired second refraction index different from the first refraction index, and the two deposition materials can be alternately deposited.

For example, a refraction index of $SiO_2$ is 1.4, a refraction index of $TiO_2$ is 2.4, and a refraction index of $Al_2O_3$ is 1.7. Therefore, since a refraction index difference is great between the $SiO_2$ and the $TiO_2$, these layers can be alternately deposited on an upper portion of the aforementioned basis color painting layer, which may achieve a ceramic pearl texture effect and a color anisotropy reproduction.

The oxide deposition layer 407 can be deposited by using an Electron (E)-beam deposition machine for depositing a transparent layer. However, the present disclosure is not limited thereto, and thus various well-known deposition manufacturing processes can be applied.

In operation 309, a second transparent layer 409 is coated on an upper portion of the oxide deposition layer 407. The second transparent layer 409 can protect the oxide deposition layer 407 and the basis color painting layer 403 from an external environment even if a second painting layer 411 to be described below is damaged. The second transparent layer 409 can also be used by spraying-painting a transparent urethane paint having a specific luster. The second transparent layer can be formed to have a thickness in the range of 10~30 μm.

In operation 311, the second painting layer 411 is formed. The second painting layer 411 is formed by painting a well-known Soft Feel (SF) paint to naturally represent a color of the basis color painting layer 403 and to produce a smooth natural texture such as a leather or a grain of wood.

The SF paint may be a urethane paint which characteristically has a soft touch feel and a leather-like outer appearance, and is advantageous in terms of humidity resistance, solvent resistance, chemical resistance, abrasion resistance, and the like. The SF paint is classified into an SF series characterized as having a smooth touch feel and outer appearance, an SF-HJ series used for products designated for the use of a hardly adhesive material, an SF-5 series for maximizing a rubber feel, an SF-6 series for maximizing a slip feel, etc. Accordingly, it is preferable to use an SF paint corresponding to a pattern characteristic of a natural material to be applied. In an implementation, the second painting layer 411, depending on the SF paint, can be formed to have a thickness in the range of 10~45 μm.

Although not shown, the first painting layer 403 and the oxide deposition layer 407 of the present disclosure are also applicable not only to an injection material based on a mold of a synthetic resin material but also to a case frame made of a metal material such as stainless steel, aluminum, magnesium, etc., formed by a process of pressing, die-casting, or the like.

According to various embodiments of the present disclosure, a case frame can have an excellent texture by reproducing a brightness and a color anisotropy on the basis of a viewing angle by adding only a simple manufacturing process. Therefore, the electronic device has high quality in general, and a user's desire for purchasing the device can be promoted.

While the present disclosure has been particularly shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method of producing a case frame, the method comprising:
 forming a case frame;
 forming a first painting layer having a first color applied to a surface of the formed case frame;
 depositing a transparent oxide deposition layer having a refractive index on an upper portion of the first painting layer; and
 forming a second painting layer having a second color on an upper portion of the transparent oxide deposition layer,
 wherein the depositing of the transparent oxide deposition layer comprises alternating deposition of at least two different types of deposition materials a plurality of times,
 wherein the depositing of the transparent oxide deposition layer comprises:
   depositing a first deposition material having a first refractive index and formed by at least two types of mixtures selected from the group consisting of SiO2-TiO2, Al2O3-TiO2, SiO2-ZrO2, Al2O3-ZrO2, and SiO2-Ta2O5, and
   depositing a second deposition material having a second refractive index and formed by at least two types of mixtures selected from the group consisting of SiO2-TiO2, Al2O3-TiO2, SiO2-ZrO2, Al2O3-ZrO2, and SiO2-Ta2O5, and
 wherein the first refractive index and the second refractive index are different.

2. The method of claim 1, wherein the at least two different types of deposition materials are deposited in the range of 3 to 10 layers.

3. The method of claim 1, wherein the transparent oxide deposition layer is formed to have a thickness in the range of 0.05~0.3 μm.

4. The method of claim 1, wherein the transparent oxide deposition layer is deposited by using an Electron (E)-beam deposition machine.

5. The method of claim 1, further comprising:
forming a first transparent layer disposed between the first painting layer and the transparent oxide deposition layer.

6. The method of claim 5,
wherein a thickness of the first transparent layer comprises a thickness in the range of 10~20 μm, and
wherein the first transparent layer comprises a transparent urethane paint.

7. The method of claim 1, wherein the first painting layer and the transparent oxide deposition layer are formed to have a total thickness in the range of 20~150 μm.

8. The method of claim 1, further comprising:
forming a second transparent layer disposed between the second painting layer and the transparent oxide deposition layer.

9. The method of claim 8,
wherein a thickness of the second transparent layer comprises a thickness in the range of 10~30 μm, and
wherein the second transparent layer comprises a transparent urethane paint.

10. The method of claim 1, wherein the forming of the second painting layer comprises depositing a Soft Feel (SF)-series urethane paint.

11. The method of claim 1,
wherein the formed case frame comprises a metal material, and
wherein the formed case frame comprises at least one of pressing and die-casting.

12. The method of claim 11, wherein the formed case frame comprises at least one of stainless steel, aluminum, magnesium, or copper.

13. The method of claim 1, further comprising:
applying the formed case frame to an electronic device.

14. The method of claim 13, wherein the electronic device comprises a mobile terminal.

15. The method of claim 1, wherein the formed case frame comprises at least one of stainless steel, aluminum, magnesium, and copper.

16. The method of claim 1, further comprising:
forming a first transparent layer having a thickness after the forming of the first painting layer; and
forming a second transparent layer having a thickness after the depositing of the transparent oxide deposition layer.

* * * * *